(12) United States Patent
West et al.

(10) Patent No.: US 10,998,278 B2
(45) Date of Patent: May 4, 2021

(54) PROCESS AND METHOD FOR ACHIEVING HIGH IMMUNITY TO ULTRAFAST HIGH VOLTAGE TRANSIENTS ACROSS INORGANIC GALVANIC ISOLATION BARRIERS

(71) Applicant: TEXAS INSTRUMENTS INCORPORATED, Dallas, TX (US)

(72) Inventors: Jeffrey Alan West, Dallas, TX (US); Thomas Dyer Bonifield, Dallas, TX (US); Yoshihiro Takei, Kashiwa (JP); Mitsuhiro Sugimoto, Tsukuba (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/832,356

(22) Filed: Mar. 27, 2020

(65) Prior Publication Data
US 2020/0312794 A1 Oct. 1, 2020

Related U.S. Application Data

(60) Provisional application No. 62/826,047, filed on Mar. 29, 2019.

(51) Int. Cl.
*H01L 23/64* (2006.01)
*H01L 25/18* (2006.01)

(52) U.S. Cl.
CPC .......... *H01L 23/642* (2013.01); *H01L 23/645* (2013.01); *H01L 25/18* (2013.01)

(58) Field of Classification Search
CPC ...... H01L 23/642; H01L 23/645; H01L 25/18

USPC ........................................................ 257/296
See application file for complete search history.

(56) References Cited

U.S. PATENT DOCUMENTS

| 9,299,697 | B2* | 3/2016 | West ...................... H01L 28/91 |
| 10,157,915 | B1 | 12/2018 | Srinivasan et al. |
| 2004/0080263 | A1* | 4/2004 | Yamazaki ........... H01L 27/3265 313/499 |

(Continued)

FOREIGN PATENT DOCUMENTS

CN 102723368 A 10/2012

OTHER PUBLICATIONS

PCT Search Report for Application No. PCT/US 2020/025746, dated Jul. 9, 2020.
English Translation CN102723368A.

*Primary Examiner* — Tong-Ho Kim
(74) *Attorney, Agent, or Firm* — Andrew R. Ralston; Charles A. Brill; Frank D. Cimino

(57) ABSTRACT

A microelectronic device contains a high voltage component having an upper plate and a lower plate. The upper plate is isolated from the lower plate by a main dielectric between the upper plate and low voltage elements at a surface of the substrate of the microelectronic device. A lower-bandgap dielectric layer is disposed between the upper plate and the main dielectric. The lower-bandgap dielectric layer contains at least one sub-layer of silicon nitride having a refractive index between 2.11 and 2.23. The lower-bandgap dielectric layer extends beyond the upper plate continuously around the upper plate. The lower-bandgap dielectric layer has an isolation break surrounding the upper plate at a distance of at least twice the thickness of the lower-bandgap dielectric layer from the upper plate.

20 Claims, 15 Drawing Sheets

(56) References Cited

U.S. PATENT DOCUMENTS

| | | | |
|---|---|---|---|
| 2015/0069572 A1* | 3/2015 | Khanolkar | H01L 23/645 257/531 |
| 2015/0333055 A1* | 11/2015 | West | H01L 29/66477 257/306 |
| 2017/0309702 A1 | 10/2017 | West et al. | |
| 2019/0206812 A1* | 7/2019 | Bonifield | H01L 28/40 |

* cited by examiner

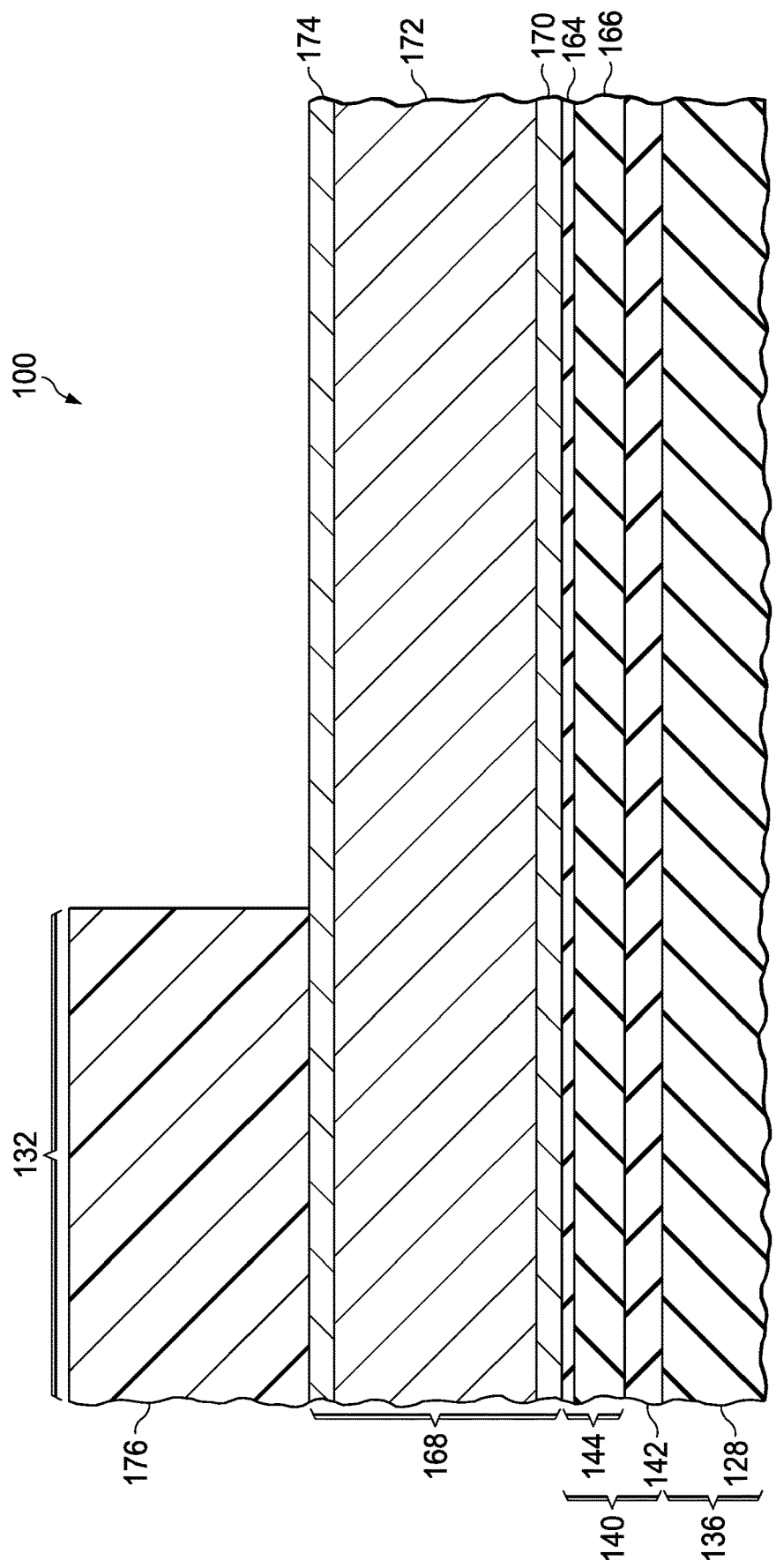

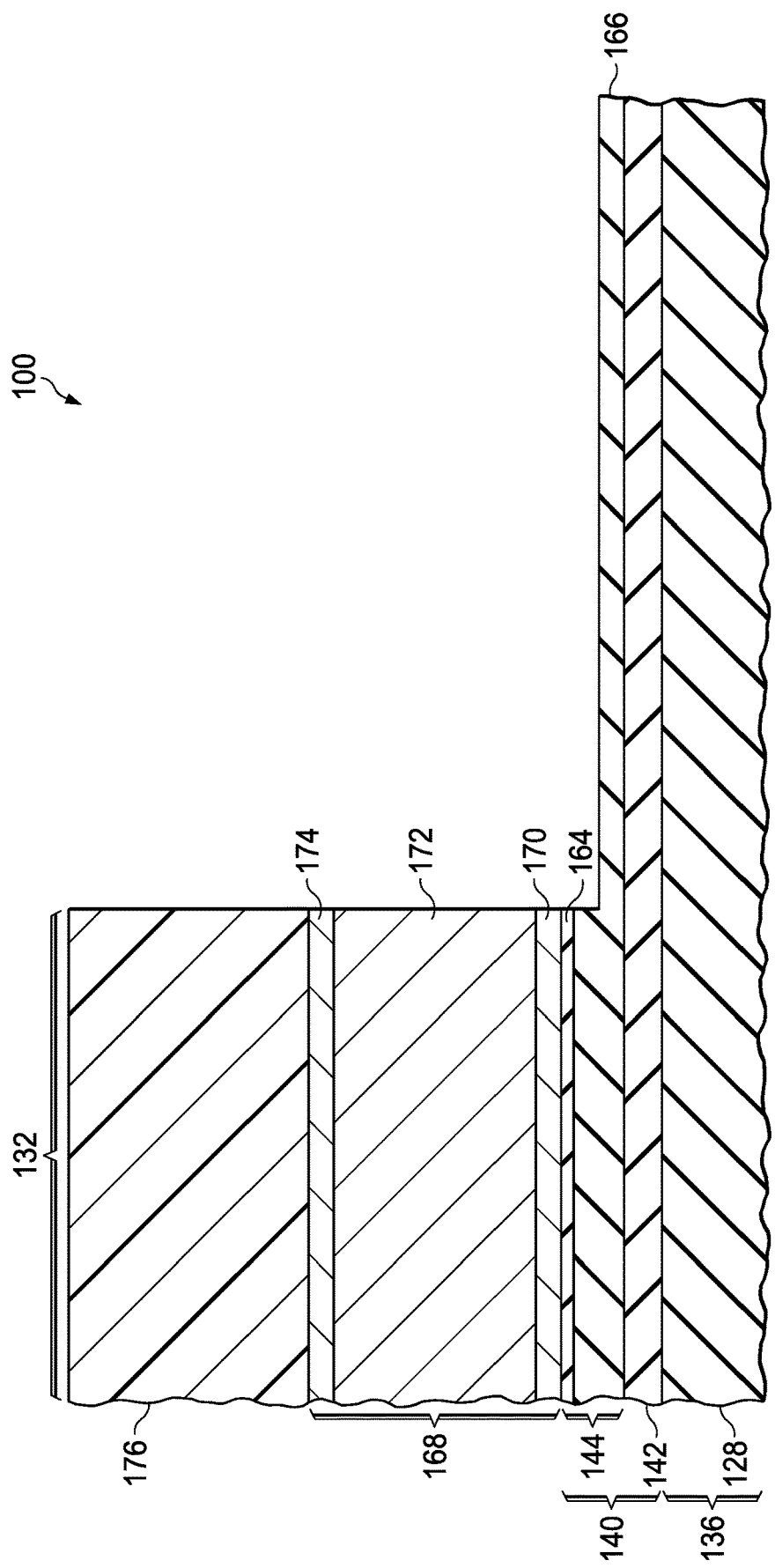

PROCESS AND METHOD FOR ACHIEVING HIGH IMMUNITY TO ULTRAFAST HIGH VOLTAGE TRANSIENTS ACROSS INORGANIC GALVANIC ISOLATION BARRIERS

CROSS REFERENCE TO RELATED APPLICATIONS

This application claims the benefit of Provisional Application Ser. No. 62/826,047, filed Mar. 29, 2019, which is herein incorporated by reference in its entirety. This application is related to U.S. Pat. Nos. 9,299,697, 10,109,574, and 10,147,784, each of which is incorporated herein in its entirety.

FIELD OF THE INVENTION

This invention relates to the field of microelectronic devices. More particularly, this invention relates to high voltage components in microelectronic devices.

BACKGROUND OF THE INVENTION

A microelectronic device with a high voltage component having a high voltage node, operable at a potential greater than 100 volts, may have a thin lower-bandgap dielectric layer between the high voltage node and a main dielectric which is several microns thick separating the high voltage node from low voltage components. The lower-bandgap dielectric layer, with a thickness commonly less than 10 percent of the thickness of the main dielectric, has a bandgap energy less than the main dielectric, and provides reliability for the main dielectric by reducing peak electric fields at corners of the high voltage node. The lower-bandgap dielectric layer may enhance high voltage performance and reliability of the device, and the degree of enhancement can be tailored by changing the refractive index value of the layer.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A microelectronic device contains a high voltage component having an upper plate and a lower plate. The upper plate is isolated from the lower plate by a main dielectric formed near a surface of a substrate of the microelectronic device. A lower-bandgap dielectric layer is disposed between the upper plate and the main dielectric. The lower-bandgap dielectric layer contains at least one sub-layer of silicon nitride. The sublayer of silicon nitride has a refractive index (RI) between 2.11 and 2.24. The lower-bandgap dielectric layer extends beyond the upper plate continuously around the upper plate. The lower-bandgap dielectric layer has an isolation break surrounding the upper plate at a distance of at least twice the thickness of the lower-bandgap dielectric layer from the upper plate.

DESCRIPTION OF THE VIEWS OF THE DRAWING

FIG. 3A through FIG. 3C are cross sections of the microelectronic device of FIG. 1 at the isolation break, depicting an alternate method of forming the isolation break and high voltage node.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A microelectronic device contains a high voltage capacitor having an upper plate (typically, a high voltage node) and a lower plate (typically, a low voltage node). The upper plate is isolated from the lower plate by a main dielectric between the upper plate and low voltage elements formed at a surface of a substrate of the microelectronic device. A lower-bandgap dielectric layer is disposed between the upper plate and the main dielectric. The lower-bandgap dielectric layer contains at least one sub-layer with a bandgap energy less than a bandgap energy of the main dielectric. The lower-bandgap dielectric layer extends beyond the upper plate continuously around the upper plate. The lower-bandgap dielectric layer has an isolation break surrounding the upper plate at a distance of at least twice the thickness of the lower-bandgap dielectric layer from the upper plate. The isolation break is located between the upper plate and low voltage elements of the microelectronic device.

As is common for IC manufacturers, there are ongoing efforts to simplify and optimize processes to both reduce cost and improve product reliability. As a result of such efforts, it was found that the number of metal levels could be reduced from seven to five while retaining high voltage capability for almost all parameters. However, a marginality was discovered in which the device failed to meet the International Electrotechnical Commission's Electrostatic Discharge (IEC-ESD) immunity standard of 8 kV (IEC/EN 61000-4-2, level 4). The IEC-ESD isolation barrier test is a system-level ultrafast transient voltage test typically not performed at component level by IC manufacturers. Many potential factors were investigated to improve IEC-ESD performance, such as thickness of the lower-bandgap dielectric layer, thickness of the main capacitor dielectric, and thermal annealing of the lower-bandgap dielectric layer, but none resulted in a solution.

Figure 4:
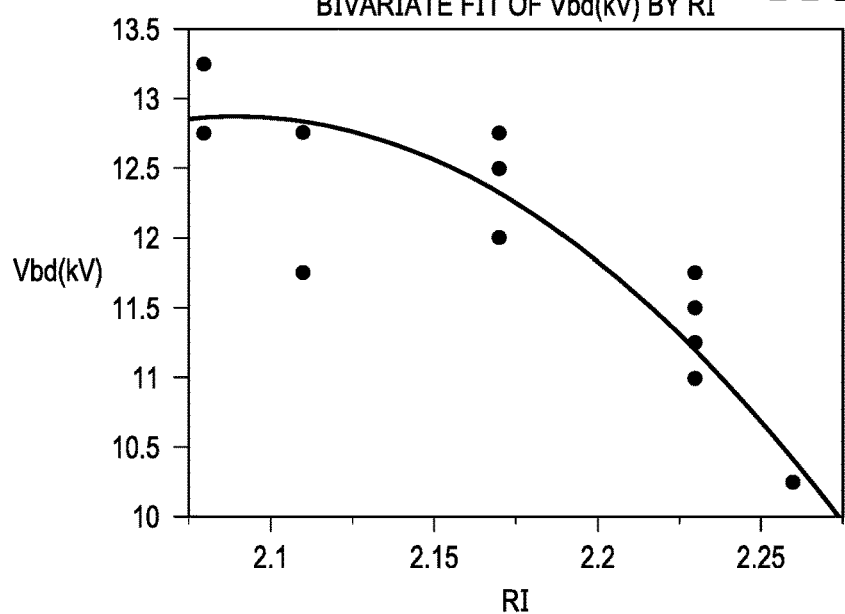
FIG. 4 is a graph of breakdown voltage Vbd versus refractive index (RI).
Figure 5:
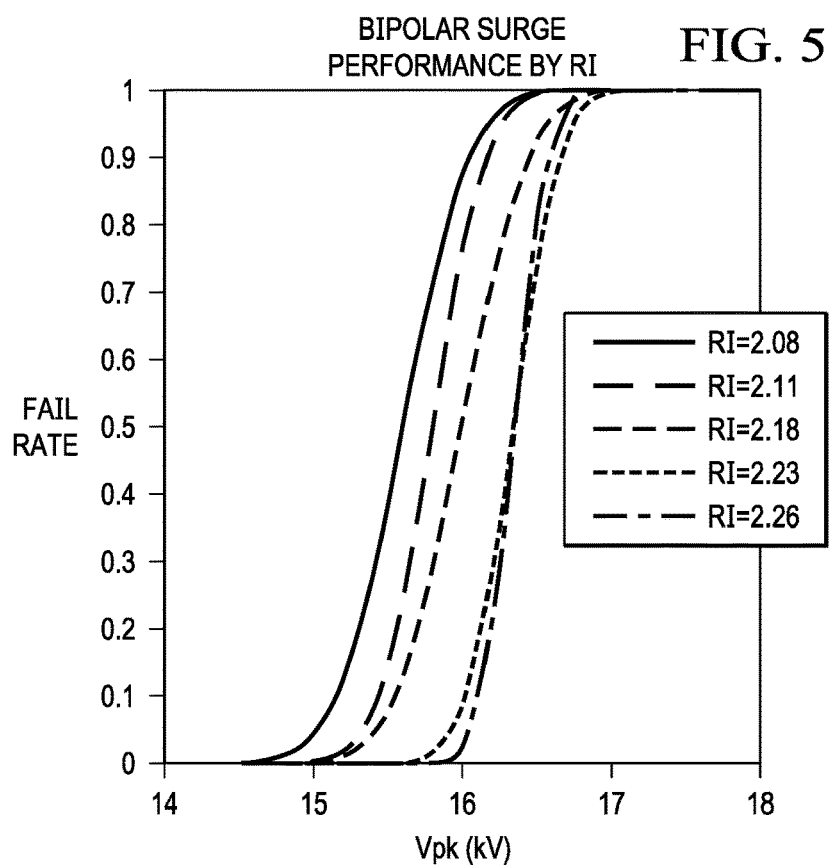
FIG. 5 is a graph of fail rate versus peak voltage Vpk at various RIs.

However, the inventors discovered an unexpected and large improvement of the IEC-ESD breakdown voltage performance of high voltage capacitors using a silicon nitride layer in the lower-bandgap layer when the silicon nitride has a lower refractive index (RI). A lower RI degrades the 1000× slower transient voltage SURGE protection, so it was counter-intuitive that the lower RI would result in an increase of the ultrafast transient breakdown voltage of such capacitors. FIG. 4 presents IEC-ESD breakdown voltage (Vbd) as a function of RI for a representative non-production test structure, where IEC-ESD Vbd was obtained using transient voltage pulses with 1.2 ns rise and 1.2 ns fall with 12 pulses at positive polarity followed by 12 pulses negative polarity. The Vbd characteristic shows a clear increase from about 10 kV to about 13 kV as the RI of the silicon nitride layer is reduced from 2.26 to 2.08. FIG. 5 presents SURGE capability as fail rate vs. peak voltage (Vpk) of a representative capacitive isolation device for five values of RI obtained using 25 voltage pulses with 1.2 µs rise, 50 µs fall followed by 25 pulses at opposite polarity with similar rise and fall times, as prescribed by reinforced isolation standard VDE-0884-11. These figures show that while the best SURGE performance is achieved for the higher RI values (>2.23), the best IEC-ESD capability is achieved at a RI less than 2.23, e.g. about 2.0 to 2.1. Thus, the inventors have determined that the SiN layer under the top high voltage (HV) capacitor plate, which provides outstanding HV performance, may not be simultaneously optimized for both SURGE capability and IEC-ESD transient capability.

Figure 6:
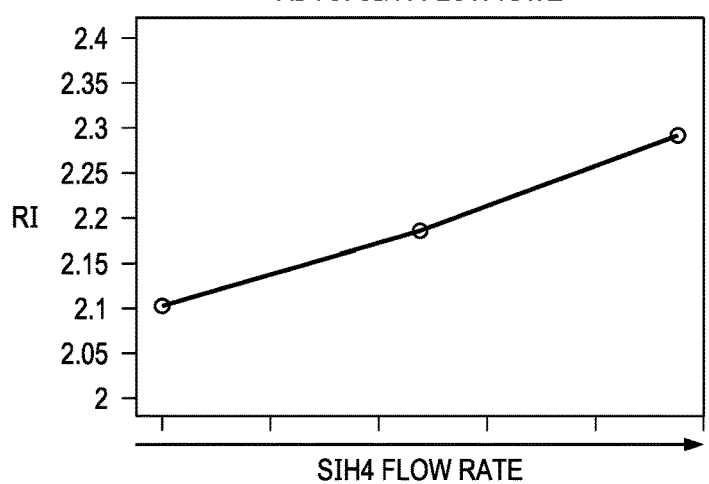
FIG. 6-10 are graphs of various parameters versus RI.
Figure 7:
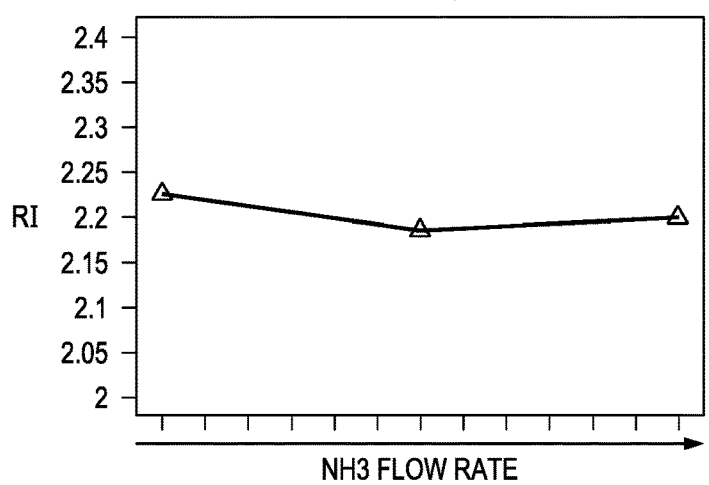
Figure 8:
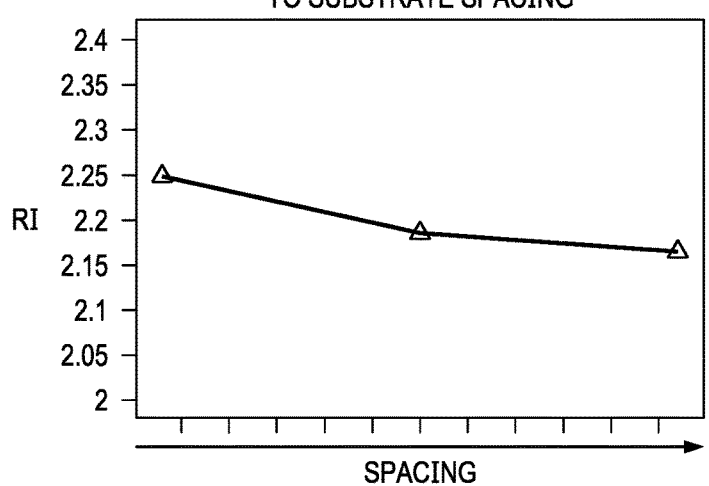
Figure 9:
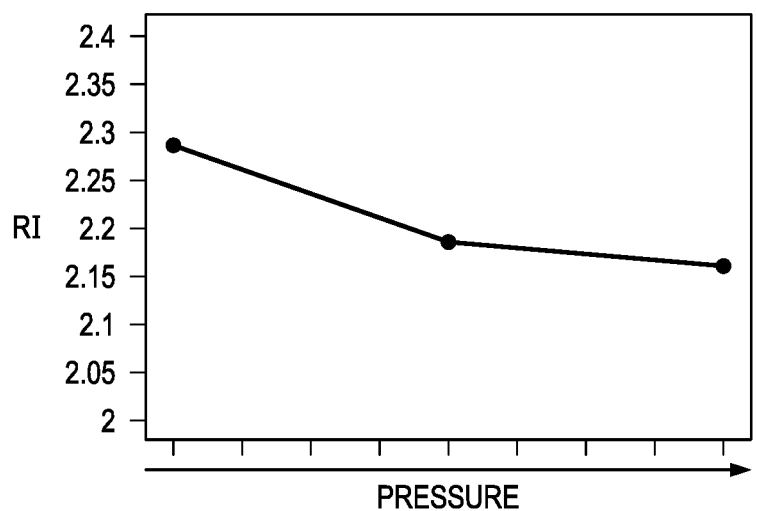
Figure 10:
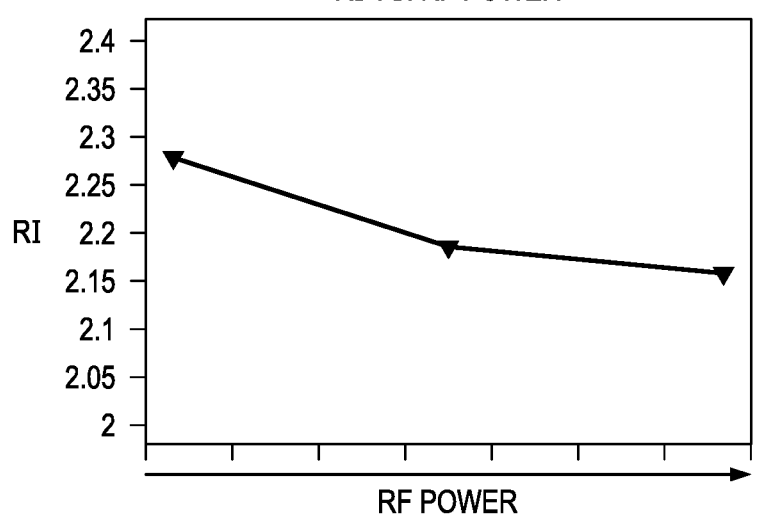

As set forth in detail below, the inventors have determined that the surge protection and IEC-ESD performance may be balanced using silicon nitride in the lower-bandgap dielectric layer that has a refractive index in the range of 2.11 to 2.23, for example 2.17±0.04. A CVD process which flows $SiH_4+NH_3+Ar$ in a plasma may be used. The gas flow ratio of $SiH_4/NH_3$ is selected to obtain a refractive index of about 2.17. Temperature, RF power, and chamber pressure also affect RI. General trends of RI dependence on key manufacturing parameters that may be applicable to multiple different deposition tools shown in FIGS. 6-10, wherein FIG. 6 presents RI vs. silane flow rate; FIG. 7 presents RI vs. ammonia flow rate; FIG. 8 presents RI vs. spacing between the reactant showerhead and substrate surface; FIG. 9 presents RI vs. deposition pressure; and FIG. 10 resents RI vs. deposition power.

Figure 1:
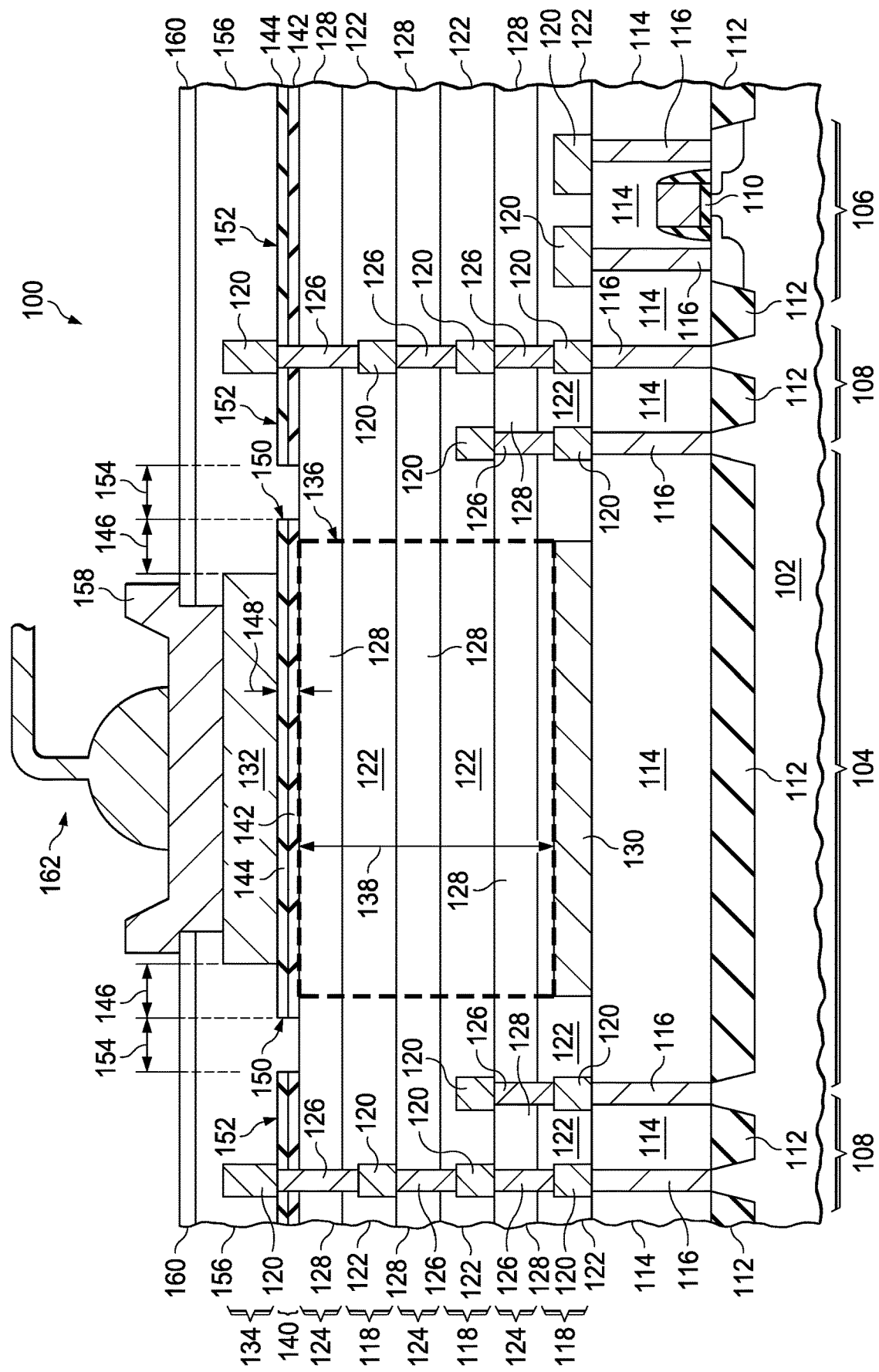
FIG. 1 is a cross section of an example microelectronic device containing a high voltage component.

Turning to FIG. 1, a cross section of an example microelectronic device 100 containing a high voltage component is presented. Various aspects of the device 100 are described without implied limitation to provide context for the lower-bandgap dielectric layer, described below. In the instant example, the microelectronic device 100 is described as an integrated circuit 100. Other configurations for the microelectronic device 100 such as a standalone component or a hybrid circuit, are within the scope of the instant example. The microelectronic device 100 is formed on a substrate 102 such as a silicon wafer. The microelectronic device 100 includes the high voltage component 104, depicted in FIG. 1 as a high voltage capacitor 104, and possibly a low voltage component 106 which operates at 24 volts or less, depicted as a metal oxide semiconductor (MOS) transistor 106 with a gate dielectric layer 110 less than 70 nm thick. The microelectronic device 100 may optionally include a Faraday cage 108 around the high voltage component 104.

Field oxide 112 may be formed in the substrate 102 to laterally isolate elements of the microelectronic device 100. A pre-metal dielectric (PMD) layer 114 is formed over the substrate 102. Contacts 116 are disposed through the PMD layer 114 to provide electrical connections for the low voltage component 106 and the Faraday cage 108.

A plurality of metal levels 118 are disposed over the PMD layer 114. The metal levels 118 include metal interconnects 120 connected to the low voltage component 106 and the Faraday cage 108. Intra-metal dielectric (IMD) layers 122 of silicon dioxide-based dielectric material are disposed between the metal interconnects 120 in each metal level 118. Via levels 124 are disposed between the metal levels 118. The via levels 124 include metal vias 126 connecting the metal interconnects 120. The metal vias 126 are disposed through inter-level dielectric (ILD) layers 128 of silicon dioxide-based dielectric material in each via level 124. Other dielectric materials for the IMD layers 122 and the ILD layers 128, such as low-k materials, are within the scope of the instant example. The IMD layers 122 and the ILD layers 128 may possibly include cap layers and etch stop layers of different dielectric materials, such as silicon nitride. The IMD layers 122 may be parts of the corresponding ILD layers 128, depending on the process sequence used to form the plurality of metal levels 118.

A lower plate 130 of the high voltage component 104, depicted as a lower plate 130 of the high voltage capacitor 104, is disposed in one of the metal levels 118, for example a first metal level 118 as depicted in FIG. 1. An upper plate 132 of the high voltage component 104, depicted as an upper plate 132 of the high voltage capacitor 104, is disposed in another metal level 134, for example a top metal level 134 as depicted in FIG. 1. The combined IMD layers 122 and ILD layers 128 between the lower plate 130 and the upper plate 132 provide a main dielectric 136 of the high voltage component 104. In the instant example, the main dielectric 136 is a capacitor dielectric 136 of the high voltage capacitor 104. A thickness 138 of the capacitor dielectric 136 is at least 2 µm, e.g. 3 µm or greater, and may be determined by a desired operating voltage of the upper plate 132 relative to the lower plate 130 and possibly the substrate 102. For example, a version of the high voltage capacitor 104 in which the upper plate 132 is designed to operate at 1000 volts rms relative to the lower plate 130 may have a capacitor dielectric 136 with a thickness 138 of 16 µm to 20 µm. Using silicon nitride with a refractive index within the range of 2.11 to 2.23 provides the unexpected benefit of significantly improved IEC-ESD performance with balanced surge protection as discussed previously.

A lower-bandgap dielectric layer 140 is disposed between the main dielectric 136 and the upper plate 132, opposite from the lower plate 130. The lower-bandgap dielectric layer 140 includes at least one dielectric sub-layer with a bandgap energy less than a bandgap energy of a portion of the main dielectric 136 adjacent to the upper plate 132. In the instant example, the lower-bandgap dielectric layer 140 includes a first sub-layer 142 of silicon oxynitride, 200 nm to 600 nm thick, contacting the main dielectric 136, and a second sub-layer 144 of silicon nitride, 400 nm to 800 nm thick (e.g. 600 nm), between the first sub-layer 142 and the upper plate 132, contacting both. The first sub-layer 142 of silicon oxynitride has a lower bandgap energy than the silicon dioxide-base dielectric material of the main dielectric 136, and the second sub-layer 144 of silicon nitride has a lower bandgap energy than the first sub-layer 142. The lower-bandgap dielectric layer 140 extends past the upper plate 132, continuously around the upper plate 132, by a distance 146 which is at least twice a thickness 148 of the lower-bandgap dielectric layer 140. There is an isolation break 150 in the lower-bandgap dielectric layer 140 contacting the upper plate 132; the isolation break 150 surrounds the upper plate 132. The isolation break 150 is located no closer to the upper plate 132 than the distance 146. An optional low voltage portion 152 of the lower-bandgap dielectric layer 140 may be disposed external to the isolation break 150 so that the low voltage portion 152 of the lower-bandgap dielectric layer 140 is separated from the lower-bandgap dielectric layer 140 contacting the upper plate 132 by the isolation break 150. The low voltage portion 152 of the lower-bandgap dielectric layer 140 may contact low voltage elements of the microelectronic device 100 which extend up to the lower-bandgap dielectric layer 140, such as the Faraday cage 108. The isolation break 150 is located between the upper plate 132 and any low voltage element of the microelectronic device 100, so that the lower-bandgap dielectric layer 140 contacting the upper plate 132 does not contact any low voltage element. The isolation break 150 advantageously prevents leakage current through an interface of the lower-bandgap dielectric layer 140 from the upper plate 132 to a low voltage element of the microelectronic device 100. The low voltage portion 152 of the lower-bandgap dielectric layer 140, if present, is laterally separated from the lower-bandgap dielectric layer 140 contacting the upper plate 132 by an isolation distance 154 which is at least 1 µm, and may be 10 µm to 25 µm to advantageously provide process margin in a lithographic process for forming the isolation break 150. Forming the lower-bandgap dielectric layer 140 with the isolation break 150 is particularly advantageous for instances of the high voltage component 104 which operate at 1000 volts or higher, as such a component without the lower-bandgap dielectric layer 140 with the isolation break 150 would have such low reliability as to preclude a useful embodiment of the microelectronic device 100.

The upper plate 132 is disposed in an upper IMD layer 156, which covers edges of the lower-bandgap dielectric layer 140 at the isolation break 150. The upper IMD layer 156 may include silicon dioxide, similarly to the main dielectric 136.

The upper plate 132 may be connected to, or may be part of, a bondpad 158 of the microelectronic device 100, as depicted in FIG. 1. A protective overcoat 160 of polyimide, silicon nitride, silicon oxynitride and/or silicon dioxide may be disposed over the upper plate 132 or may overlap edges of the upper plate 132 as depicted in FIG. 1. An electrical connection 162 to the upper plate 132 may be made through a wirebond 162. The low voltage portion 152 of the lower-bandgap dielectric layer 140 may advantageously shield the low voltage components 106 from electric fields from the electrical connection 162 to the upper plate 132.

During operation of the microelectronic device 100, when a high voltage potential difference is applied between the upper plate 132 and the lower plate 130, the lower-bandgap dielectric layer 140 advantageously provides reliability for the main dielectric 136 by reducing an electric field near corners of the upper plate 132. The isolation break 150 advantageously provides reliability by preventing leakage current through the lower-bandgap dielectric layer 140 from the upper plate 132 to a low voltage element of the microelectronic device 100.

Figure 2A:
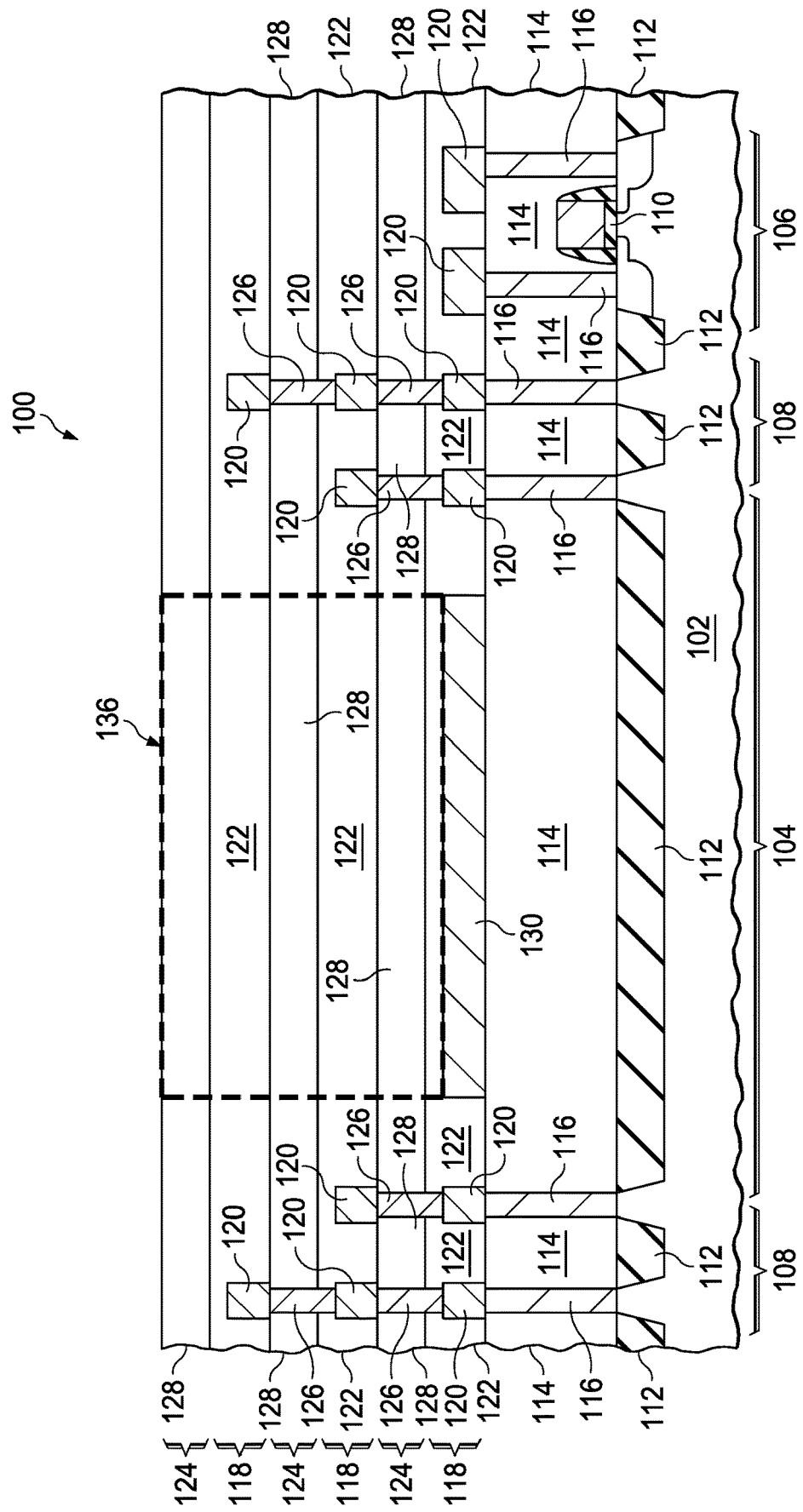
FIG. 2A through FIG. 2F are cross sections of the microelectronic device of FIG. 1, depicted in successive stages of fabrication.

FIG. 2A through FIG. 2F are cross sections of the microelectronic device of FIG. 1, depicted in successive stages of fabrication. Referring to FIG. 2A, the microelectronic device 100 is formed on the substrate 102, which may be a silicon wafer or other semiconductor substrate, or may be a dielectric substrate such as sapphire or aluminum oxide ceramic. In versions of the instant example in which the substrate 102 is a semiconductor substrate, the field oxide 112 may be formed to laterally isolate elements of the microelectronic device 100 in the substrate 102. The field oxide 112 may be formed by a shallow trench isolation (STI) process, a local oxidation of silicon (LOCOS) process or other method.

The low voltage component 106 is formed in and on the substrate 102. The low voltage component 106 may be proximate to the high voltage component 104, and may be separated from the high voltage component 104 by the Faraday cage 108.

The PMD layer 114 is formed over the substrate 102. The PMD layer 114 may include a dielectric layer stack including a silicon nitride or silicon dioxide PMD liner 10 to 100 nm thick formed by a plasma enhanced chemical vapor deposition (PECVD) process, a layer of silicon dioxide, phosphorus silicate glass (PSG) or boron phosphorus silicate glass (BPSG) formed by a PECVD process, commonly 100 nm to 1000 nm thick, commonly leveled by a chemical-mechanical polish (CMP) process, and an optional PMD cap layer, commonly 10 to 100 nm of a hard material such as silicon nitride, silicon carbide nitride or silicon carbide formed by another PECVD process. Contact holes are formed through the PMD layer 114 to expose the substrate 102, for example in the low voltage component 106 and the Faraday cage 108 and possibly in the high voltage component 104. The contacts 116 are formed in the contacts holes to provide electrical connections. The contacts 116 may be formed by forming a liner of titanium and titanium nitride using a sputter process and CVD process respectively, forming a tungsten layer on the liner using a CVD plasma process to fill the contact holes, and removing the tungsten and liner from a top surface of the PMD layer 114 using an etchback and/or a CMP process.

The metal levels 118 and IMD layers 122, and the via levels 124 and the ILD layers 128, may be formed by any of several methods. In one version of the instant example, any of the metal levels 118 may be formed by forming an aluminum-based interconnect metal layer over the underlying PMD layer 114 or ILD layer 128. The aluminum-based interconnect metal layer may include an adhesion layer of titanium, titanium tungsten or titanium nitride, an aluminum layer containing a few percent silicon, titanium and/or copper, 200 nm to several microns thick, on the adhesion layer, and possibly an anti-reflection layer of titanium or titanium nitride on the aluminum layer. An interconnect etch mask including photoresist is formed over the interconnect metal layer covering areas for the metal interconnects 120, and an etch process such as a plasma etch using chlorine radicals is used to remove the interconnect metal layer in areas exposed by the interconnect etch mask, leaving the metal interconnects 120. The corresponding IMD layer 122 is subsequently-formed between the metal interconnects 120. The IMD layer 122 may be formed by depositing a layer of silicon dioxide-based dielectric material by a PECVD process using tetraethyl orthosilicate, also known as tetraethoxysilane (TEOS), and subsequently planarizing the dielectric material by a resist etchback process or a CMP process, so that the IMD layer 122 covers metal interconnects 120 as shown in FIG. 1. The IMD layer 122 may possibly include silicon dioxide-based dielectric material formed by spin coating the microelectronic device 100 with a solution containing methylsilsesquioxane (MSQ) and subsequently baking the solution to remove volatile material.

In another version of the instant example, any of the metal levels 118 may be formed by a single damascene process in which the IMD layer 122 is formed first, and interconnect trenches are formed through the IMD layer 122 in areas for the metal interconnects 120. The IMD layer 122 may be a stack of dielectric layers including an etch stop layer, a main layer and a cap layer, formed by sequential PECVD processes. A liner of tantalum nitride is formed by a CVD plasma process over the IMD layer 122, extending into the interconnect trenches as a conformal liner. A seed layer of sputtered copper is formed on the liner and electroplated copper is formed on the seed layer to fill the interconnect trenches. A copper CMP process removes the copper and liner from a top surface of the IMD layer 122, leaving the metal interconnects 120 in the interconnect trenches.

In a further version, the metal interconnects 120 may be formed by a liftoff process, in which a liftoff pattern of organic material such as photoresist is formed over the corresponding lower ILD layer 128 which has openings for the metal interconnects 120. Metal layers for the metal interconnects 120 are deposited over the liftoff pattern and onto the ILD layer 128 in the openings. The liftoff pattern is subsequently removed using a solvent spray, taking the metals layers on the liftoff pattern, leaving the metal interconnects 120.

In one version of the instant example, any of the via levels 124, including the corresponding vias 126 and ILD layer 128 may be formed by a similar process as described for the contacts 116. In another version, the via levels 124, including the corresponding vias 126 and ILD layer 128 may be formed by a single damascene process as described for the metal levels 118 including the metal interconnects 120 and the IMD layer 122.

In an alternate version of the instant example, any of the metal levels 118 and corresponding lower via levels 124 may be formed concurrently by a dual damascene process. In a dual damascene process, the ILD layer 128 is formed and the corresponding IMD layer 122 is formed over the ILD layer 128. Interconnect trenches are formed through the IMD layer 122 and via holes are formed through the ILD layer 128, by a sequence of pattern and etch steps, which may be, for example a trench-first sequence, a via-first sequence, or a partial via-first sequence. A liner, seed layer and electroplated copper fill metal are formed over the IMD layer 122, concurrently filling the via holes and the interconnect trenches. A subsequent copper CMP process removes the copper and liner from the top surface of the IMD layer 122, leaving the metal interconnects 120 in the interconnect trenches and the vias 126 in the via holes.

In another version of the instant example, any of the metal levels 118 may be formed by a masked plating process. An adhesion layer of titanium and a seed layer of copper are formed on a top surface of the relevant ILD layer 128. The adhesion layer makes electrical contact to underlying instances of the vias 126 or contacts 116. A plating mask of photoresist is formed over the seed layer so as to expose areas for the metal interconnects 120. An electroplating operation plates copper on the seed layer in the areas exposed by the plating mask to a desired thickness. The plating mask is removed, for example by ashing or by dissolving in a solvent. The seed layer and the adhesion layer outside the plated copper are removed, for example by reactive ion etch (RIE) processes, leaving the plated copper and underlying seed layer and adhesion layer to provide the metal interconnects 120.

The lower plate 130 of the high voltage component 104 is formed in one of the lower metal levels 118, possibly the lowest metal level 118. The lower plate 130 may be formed concurrently with the metal interconnects 120 in the metal level 118. Alternatively, the lower plate 130 may possibly be formed separately from the metal interconnects 120. The ILD layers 128 and the IMD layers 122 above the lower plate 130 provide the main dielectric 136 of the high voltage component 104.

Figure 2B:
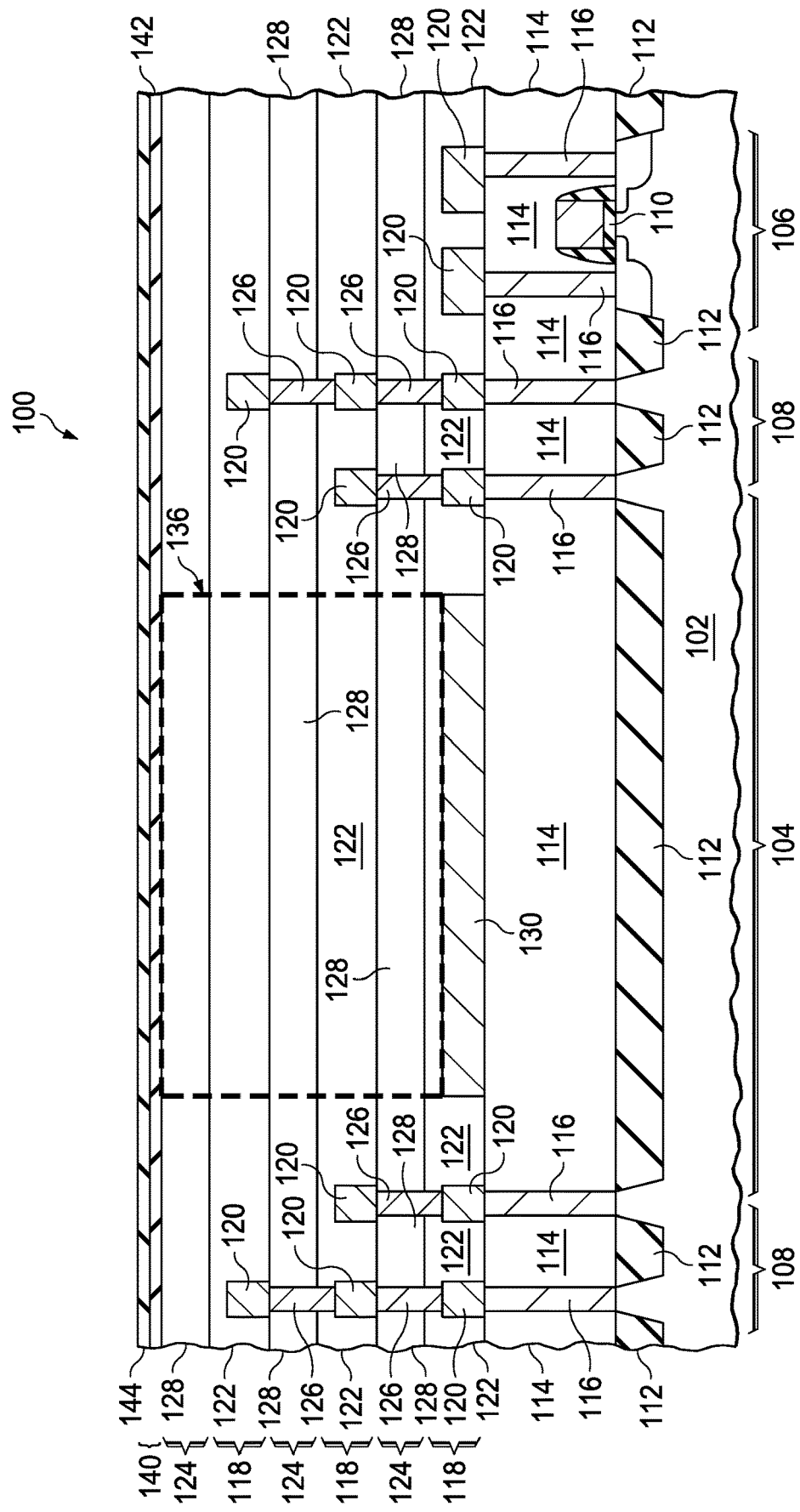

Referring to FIG. 2B, the lower-bandgap dielectric layer 140 is formed over the ILD layers 128 and the IMD layers 122 which contain the main dielectric 136 of the high voltage component 104. Lower band-gap dielectric layer 140 comprises at least one layer of silicon nitride. In the instant example, formation of the lower-bandgap dielectric layer 140 proceeds by forming the first sub-layer 142 of silicon oxynitride (sometimes referred to as silicon oxide nitride, or SiON), 200 nm to 600 nm thick, by a PECVD reaction using bis (tertiary-butylamino) silane (BTBAS) and TEOS or $N_2O$ and $NH_3$. Atomic fractions of nitrogen and oxygen in the first sub-layer 142 may be selected by adjusting relative gas flows of the nitrogen-containing and oxygen-containing feed gasses. Formation of the lower-bandgap dielectric layer 140 continues by forming the second sub-layer 144 of silicon nitride, 400 nm to 800 nm thick, by a CVD process which flows SiH4+NH3+Ar in a plasma at ~375 C. In other versions of the instant example, the lower-bandgap dielectric layer 140 may consist of only one sub-layer of silicon nitride. Several key parameters affect RI, such as gas ratio, RF power and pressure. The interaction between RI and various parameters is shown in FIG. 6-10. The silicon nitride has an RI in the range of 2.11 to 2.24 and may be formed using the parameters shown in Table 1.

TABLE 1

| Parameter | Units | NIT GR 5.5 | Notes |
|---|---|---|---|
| N2A | cc/min | 0 | |
| N2B | cc/min | 1300 | |
| SiH4 | cc/min | 690 ± 65 | |
| NH3 | cc/min | ** ± 450 | NH3 flow depends on channel |
| HFRF | Watt | 575 ± 80 | |
| LFRF | Watt | 425 ± 60 | |
| Pres | Torr | 2.3 ± 0.3 | |
| TEMP | Deg C. | 400 | |
| hiPr | Torr | 2.5 ± 0.3 | |

** CVD001A: 3795 sccm
CVD201B: 4280 sccm
CVD201C: 4210 sccm

In further versions, the lower-bandgap dielectric layer 140 may have more than two sub-layers. Dielectric materials which may be used for sub-layers of the lower-bandgap dielectric layer 140 may include the dielectric materials of Table 2.

TABLE 2

| Dielectric Material | Bandgap Range (electron volts) |
|---|---|
| silicon oxide nitride | ~7.5 |
| silicon nitride | 4.7 to ~6 |
| silicon oxide carbide nitride | higher than silicon carbide nitride |
| silicon carbide nitride | 3.8 to 4.7 |
| tantalum pentoxide | 3.8 to 5.3 |

TABLE 2-continued

| Dielectric Material | Bandgap Range (electron volts) |
| --- | --- |
| Diamond-like carbon | 5.5 |
| titanium dioxide | 3.3 |
| aluminum nitride | 6.2 |
| aluminum oxide | 6.5 to 7.0 |
| silicon monoxide | lower than SiO2 |
| zinc oxide | 3.4 |

Bandgaps of variable stoichiometry materials in Table 2 such as silicon oxide nitride, silicon oxide carbide nitride and silicon carbide nitride may vary, depending on a relative atomic fraction of oxygen, nitrogen and/or carbon. Versions of silicon-containing dielectric materials which are silicon rich may provide poor performance as sub-layers of the lower-bandgap dielectric layer 140 due to less-than-desired electrical impedance.

Figure 2C:
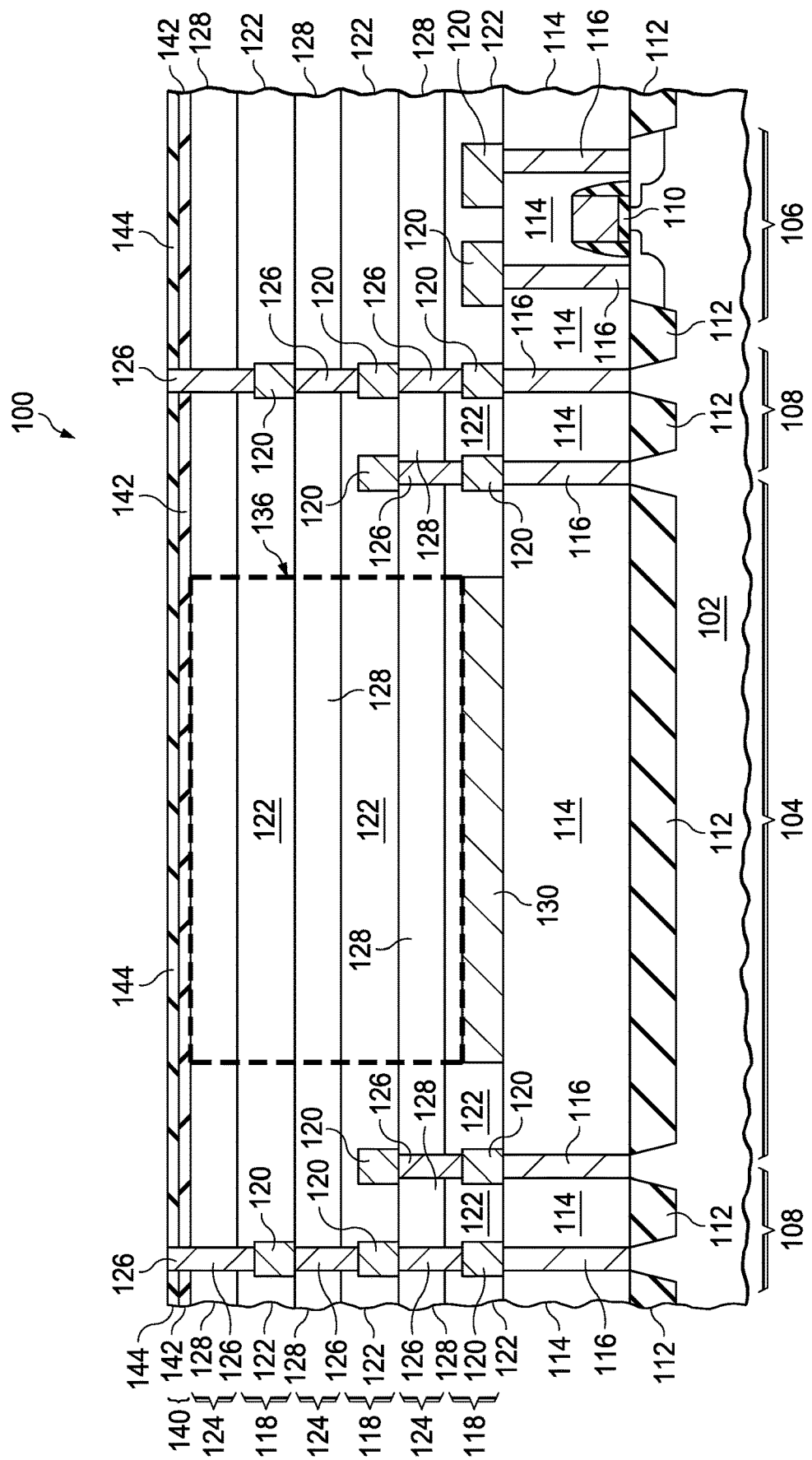

Referring to FIG. 2C, the vias 126 through the lower-bandgap dielectric layer 140 are formed after the lower-bandgap dielectric layer 140 is formed. The vias 126 through the lower-bandgap dielectric layer 140 may be formed by any of the methods described in reference to FIG. 2A.

Figure 2D:
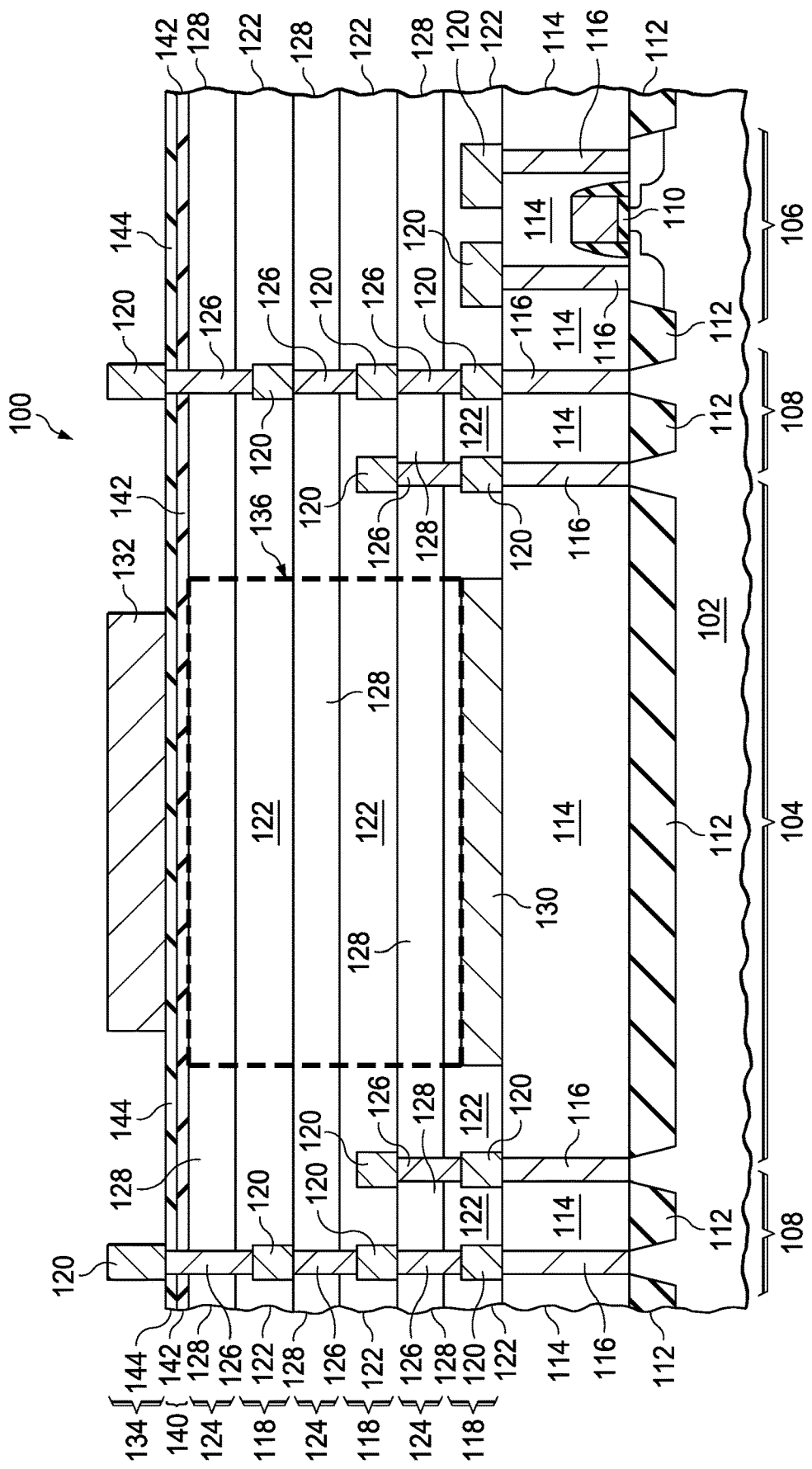

Referring to FIG. 2D, the metal interconnects 120 above the lower-bandgap dielectric layer 140 and the upper plate 132 are formed. The metal interconnects 120 above the lower-bandgap dielectric layer 140 may be formed using any of the methods described in reference to FIG. 2A. The upper plate 132 may be formed concurrently with the metal interconnects 120 above the lower-bandgap dielectric layer 140, or may be formed separately.

Figure 2E:
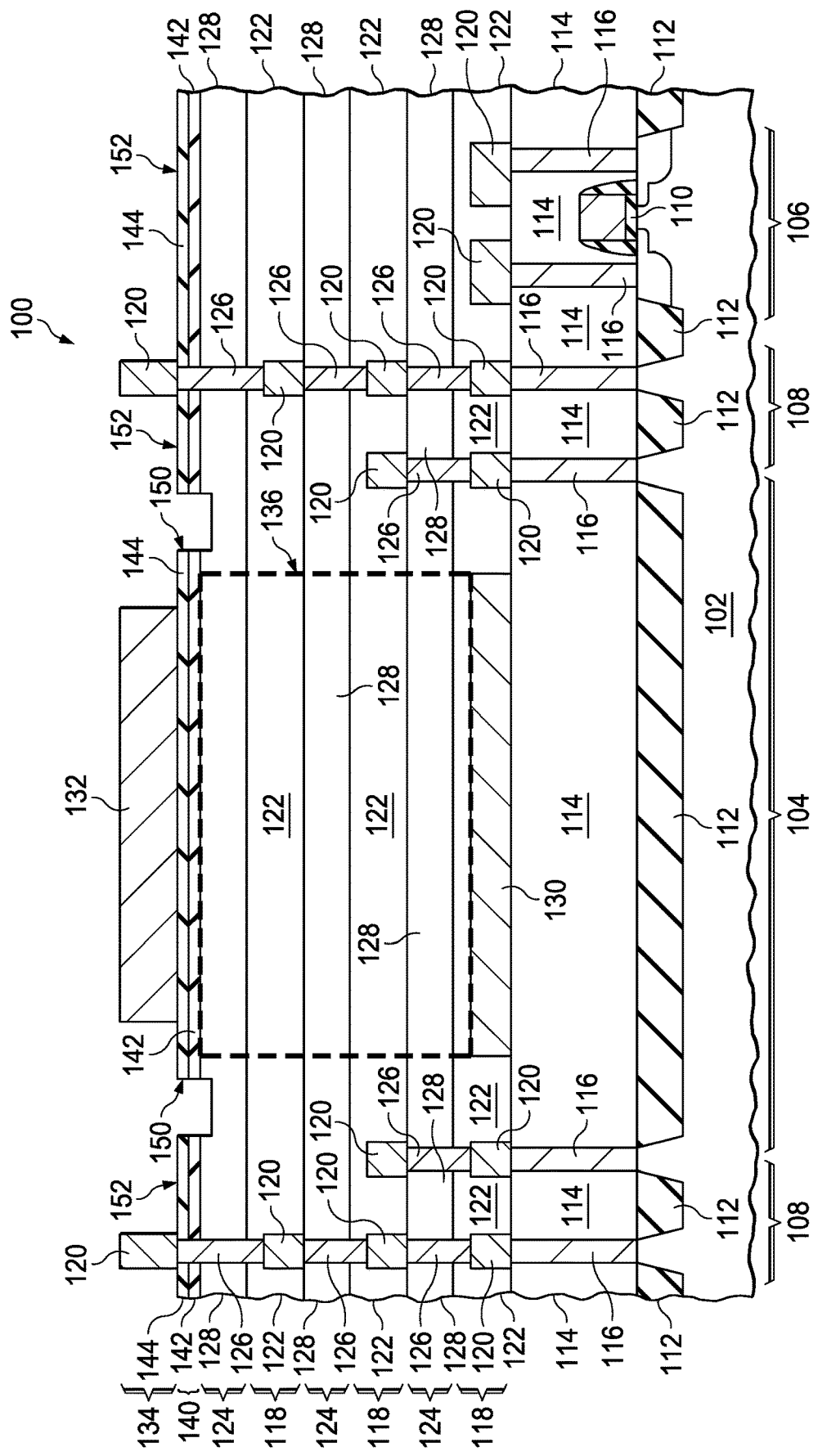

Referring to FIG. 2E, the isolation break 150 is formed through the lower-bandgap dielectric layer 140. The isolation break 150 may be formed by forming an isolation etch mask over the lower-bandgap dielectric layer 140, the metal interconnects 120 above the lower-bandgap dielectric layer, and the upper plate 132, and etching through the lower-bandgap dielectric layer 140 into the underlying ILD layer 128, leaving the lower-bandgap dielectric layer 140 under the upper plate 132 and the low voltage portion 152 of the lower-bandgap dielectric layer 140. Other methods of forming the isolation break 150 are discussed below.

Figure 2F:
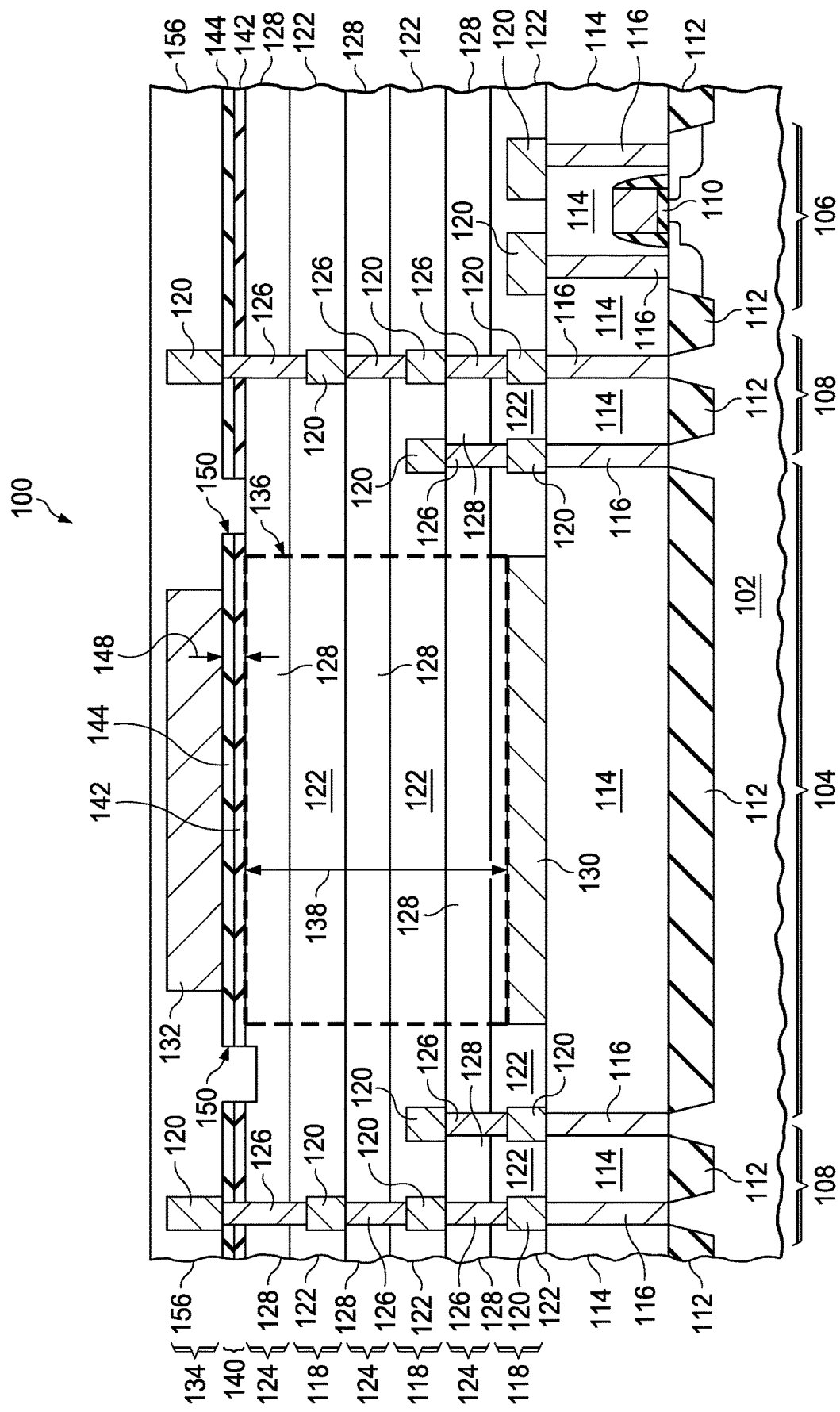

Referring to FIG. 2F, the IMD layer 156 above the lower-bandgap dielectric layer 140 is formed, abutting the isolation break 150. The IMD layer 156 above the lower-bandgap dielectric layer 140 may be formed by any of the methods described in reference to FIG. 2A. Forming the IMD layer 156 to abut the isolation break 150 advantageously prevents leakage current through an interface of the lower-bandgap dielectric layer 140 from the upper plate 132 to a low voltage element of the microelectronic device 100. Formation of the microelectronic device 100 continues with formation of the protective overcoat 160 to subsequently provide the structure of FIG. 1.

Figure 3C:
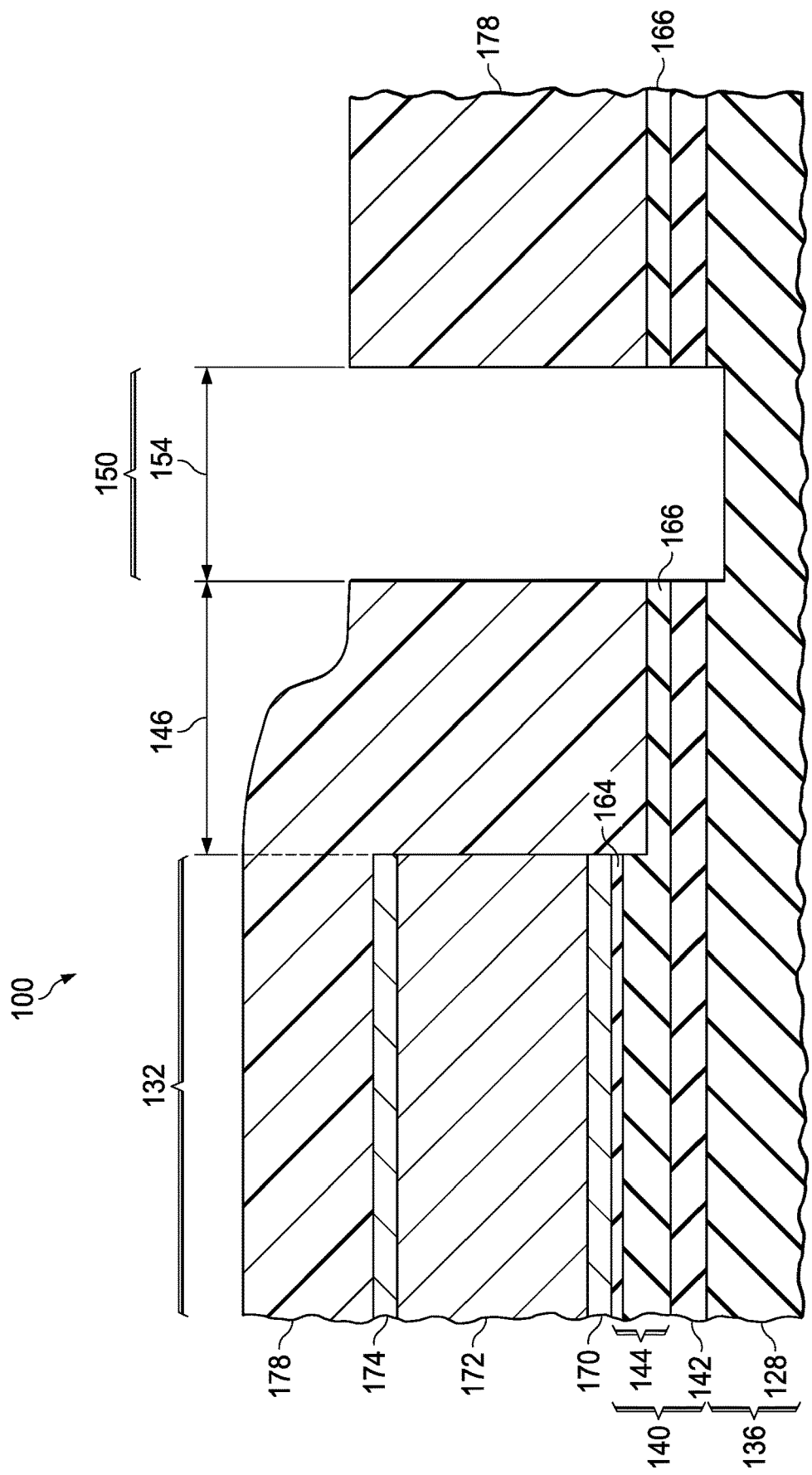

FIG. 3A through FIG. 3C are cross sections of the microelectronic device of FIG. 1 at the isolation break, depicting an alternate method of forming the isolation break and high voltage node. Referring to FIG. 3A, the microelectronic device 100 is fabricated as described in reference to FIG. 2A through FIG. 2C. The lower-bandgap dielectric layer 140 is formed over the ILD layer 128 at a top of the main dielectric 136. In the instant example, the lower-bandgap dielectric layer 140 includes the first sub-layer 142 formed on the ILD layer 128 and the second sub-layer 144 formed on the first sub-layer 142. After formation of the second sub-layer 144, an oxidizing process, for example an N2O plasma process, forms an oxygen-rich top region 164 at a top of the second sub-layer 144. The oxygen-rich top region 164 may be less than 30 nm thick. A lower region 166 of the second sub-layer 144 is substantially unchanged by the oxidizing process.

A layer of interconnect metal 168 is formed on the lower-bandgap dielectric layer 140. The layer of interconnect metal 168 includes an adhesion layer 170 of titanium, titanium tungsten or titanium nitride, 2 nm to 15 nm thick, formed by a sputter process or a reactive sputter process. The layer of interconnect metal 168 further includes an aluminum layer 172 formed on the adhesion layer 170. The aluminum layer 172 may include up to 2% percent of silicon, titanium and/or copper. The aluminum layer 172 may be 200 nm to several microns thick, formed by a sputter process. The layer of interconnect metal 168 also includes an anti-reflection layer 174 of titanium nitride, 10 nm to 20 nm thick, formed by a reactive sputter process on the aluminum layer 172. Other configurations for the layer of interconnect metal 168 are within the scope of the instant example.

An interconnect mask 176 is formed over the layer of interconnect metal 168 to cover areas for the upper plate 132 and the metal interconnects 120 of FIG. 1 above the lower-bandgap dielectric layer 140. The interconnect mask 176 may include photoresist formed by a photolithographic process, and may also include an anti-reflection layer and/or a hard mask layer. FIG. 3A depicts a portion of the interconnect mask 176 over the subsequently-formed upper plate 132.

Referring to FIG. 3B, an interconnect etch process removes the layer of interconnect metal 168 in areas exposed by the interconnect mask 176, leaving the upper plate 132 and the metal interconnects 120 of FIG. 1 above the lower-bandgap dielectric layer 140. In the instant example, the interconnect etch process further removes a portion, but not all, of the second sub-layer 144 of the lower-bandgap dielectric layer 140 in the areas exposed by the interconnect mask 176. The interconnect mask 176 is subsequently removed, for example by an ash process. At least 10 nm of the second sub-layer 144 remains in the areas exposed by the interconnect mask 176 after the interconnect etch process is completed and the interconnect mask 176 is removed.

Referring to FIG. 3C, an isolation etch mask 178 is formed over the upper plate 132 and the lower-bandgap dielectric layer 140 to expose an area for the isolation break 150. The isolation etch mask 178 may include photoresist formed by a photolithographic process. The area for the isolation break 150 is laterally separated from the upper plate 132 by the distance 146 as described in reference to FIG. 1. The width 154 of the area for the isolation break 150 is described in reference to FIG. 1. The width 154 may be 10 μm to 25 μm to advantageously facilitate the photolithographic process for formation of the isolation etch mask 178 with a desired level of process margin. An isolation etch process removes the first sublayer 142, the second sub-layer 144, and a portion of the ILD layer 128 in the area exposed by the isolation etch mask 178. The isolation etch mask 178 is subsequently removed, for example by an ash process.

Figure 11:
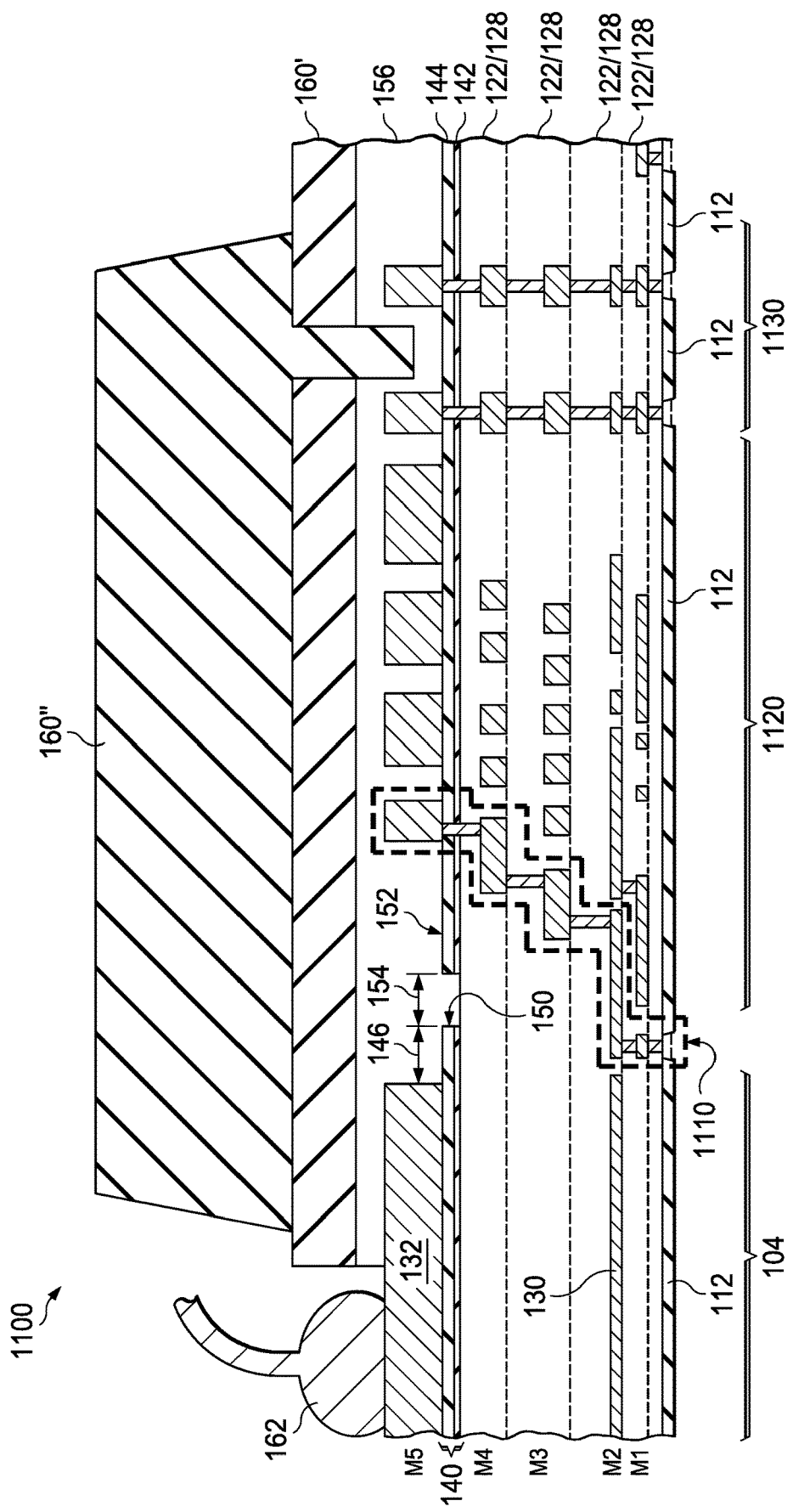
FIG. 11 is a cross-section of another example microelectronic device containing a high voltage component.

FIG. 11 is cross-section of another example microelectronic device 1100 that shares some characteristics of the microelectronic device 100 of FIG. 1. In FIG. 11, structural features that are similar to those of FIG. 1 retain same feature references while recognizing that various material substitutions may be made within the scope of the previous discussion. The substrate 102 is omitted to save space. The device 1100 includes five metal levels M1-M5 with four via levels. Feature indexes of the metal elements and vias are omitted for clarity. Metal features and vias are located within IMD layer 122 and ILD layer 128 as described previously. These dielectric layers are represented by combined indexes 122/128 for clarity. A high-voltage capacitor 104 includes a lower plate 130 formed within the M2 layer and an upper plate 132 formed within the M5 layer. The high-voltage capacitor 104 is surrounded by a Faraday cage 1110 that includes a continuous chain from M5 to M1 through associated via levels and is grounded to the underlying substrate at an unreferenced contact. Circuitry 1120 outside the Faraday cage 1110 may support other attributes of the device, such as analog to digital converters, digital transmission or reception of data across the high-voltage capacitor 104. A scribe seal structure 1130 includes stacked M1-M5 features and associated vias. Upper IMD layer 156 as previously described, for example 1.5 µm of $SiO_2$, covers the M5 level. A first protective overcoat 160', for example 2.8 µm SiON, covers the upper IMD level 156, and a second protective overcoat 160", for example 10 µm polyimide, covers the first protective overcoat 160'. In the instant example, a wirebond 162 is made directly to the upper plate 132.

A lower-bandgap dielectric layer 140 is located between M5 features, including the upper plate 132, and the dielectric layers 122/128 on which the M5 layer is formed. The lower-bandgap dielectric layer 140 in the instant example includes a first sub-layer 142 of SiON and a second sub-layer 144 of silicon nitride, both of which may be formed as previously described. The lower-bandgap dielectric layer 140 extends past the upper plate 132, continuously around the upper plate 132, by a distance 146, as previously described, and ends at an isolation break 152 that surrounds the upper plate 132. A low-voltage portion 152 of the lower-bandgap dielectric layer 140 is spaced apart by distance 154 from the lower-bandgap dielectric layer 140 portion that extends from the upper plate 132. The low-voltage portion 152 extends to and past the scribe seal 1130.

Figure 12:
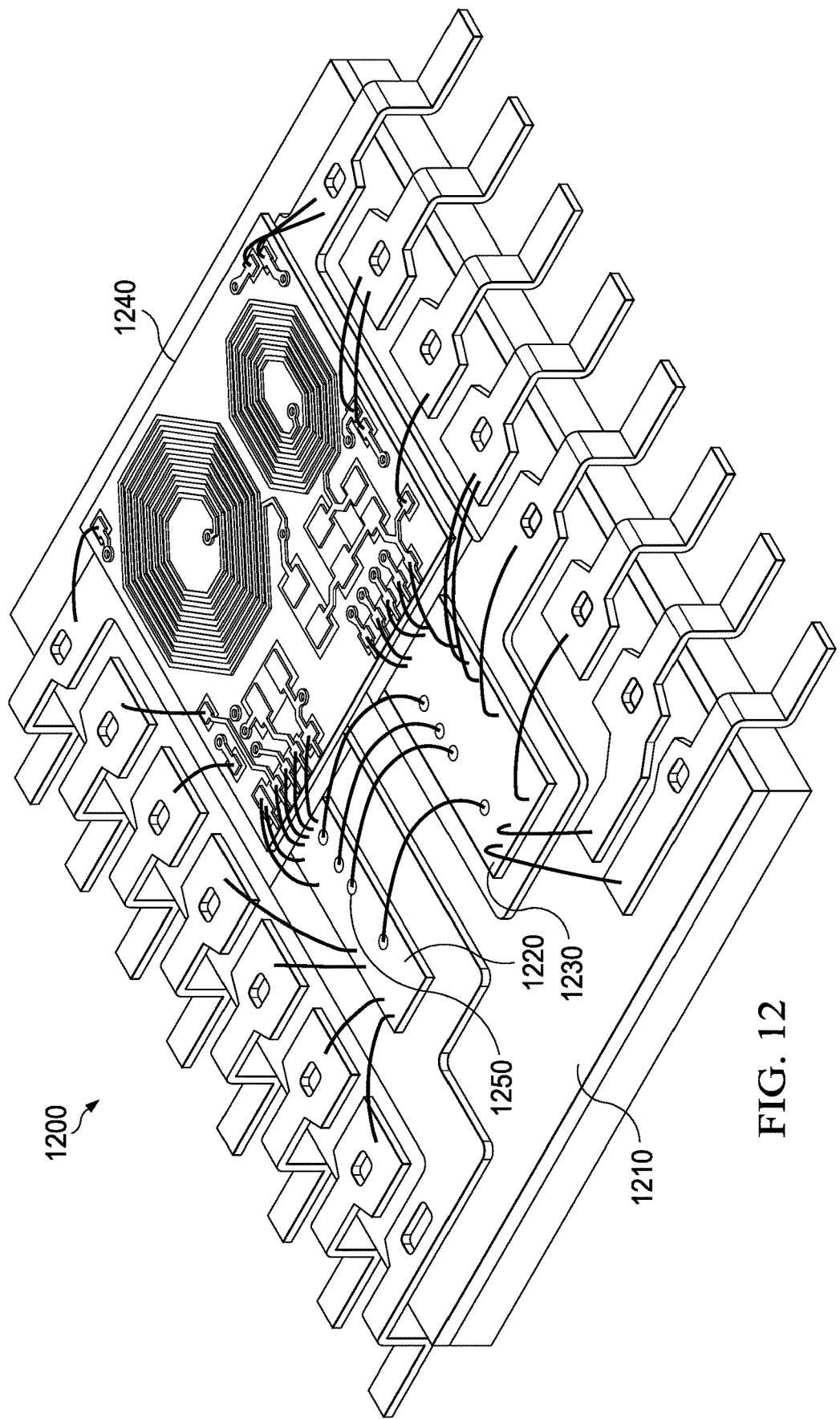
FIG. 12 is a 3-dimensional (isometric) view of a multi-chip module MCM having a laminate inductor packaged with an ISO device that includes the high voltage component of FIGS. 1 and 11.

FIG. 12 illustrates another example including a multi-chip-module (MCM) 1200 that includes one or more high voltage capacitors according to the examples described herein. A package substrate 1210 supports multiple device die, for example and a laminate transformer 1240 that may provide isolated power transfer between the device dies 1220, 1230. Each of the first and second device dies 1220, 1230 may include one or more instances of a high voltage capacitor 1250 that is/are constructed according to the principles described herein. The device dies 1220, 1230 may also include one or more instances (not shown) of a high voltage capacitor that is/are constructed according to the principles described herein. In particular the high voltage capacitors 1250 include the lower-bandgap dielectric layer 140 described previously. The device 1200 is expected to benefit from the improved high voltage performance associated with the silicon nitride sublayer 144 having a lower bandgap energy and a refractive index in a range of 2.11 to 2.24, for example 2.14±0.04. The high voltage capacitors 1250 improve the overall IEC-ESD performance of a system compared to use of $SiO_2$ capacitors that do not include the lower-bandgap dielectric layer 140. An improvement of 2300 V improvement can be obtained with this combination of the laminate transformer and device dies 1220, 1230. Other types of MCMs having different device arrangements and/or functionality are within the scope of the disclosure.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A microelectronic device, comprising:
    a lower plate of a high voltage capacitor of the microelectronic device;
    an upper plate of the high voltage capacitor;
    a main dielectric at least 2 microns thick disposed between the lower plate and the upper plate; and
    a lower-bandgap dielectric layer disposed between the main dielectric and the upper plate, wherein:
        the lower-bandgap dielectric layer comprises at least a first sub-layer of silicon nitride having a refractive index in the range of 2.11-2.23;
        the lower-bandgap dielectric layer extends past the upper plate continuously around the upper plate, by a distance which is at least twice a thickness of the lower-bandgap dielectric layer;
        there is an isolation break in the lower-bandgap dielectric layer so that the lower-bandgap dielectric layer is not continuous at the isolation break; and
        the isolation break surrounds the upper plate.

2. The microelectronic device of claim 1, wherein the lower-bandgap dielectric layer further comprises a second sub-layer disposed between the first sub-layer and the lower plate, the second sub-layer having a bandgap energy less than the bandgap energy of the main dielectric layer.

3. The microelectronic device of claim 2, wherein the portion of the main dielectric adjacent to the lower-bandgap dielectric layer comprises silicon dioxide-based dielectric material and the second sub-layer comprises silicon oxide nitride.

4. The microelectronic device of claim 1, wherein the main dielectric comprises a plurality of intra-metal dielectric (IMD) layers comprising silicon dioxide-based dielectric material and inter-level dielectric (ILD) layers comprising silicon dioxide-based dielectric material.

5. The microelectronic device of claim 1, further comprising a low voltage component disposed outside of the isolation break.

6. The microelectronic device of claim 5, wherein the low voltage component is a metal oxide semiconductor (MOS) transistor with a gate dielectric layer less than 70 nm thick.

7. The microelectronic device of claim 1, wherein the lower-bandgap dielectric layer comprises a portion disposed outside of the isolation break.

8. The microelectronic device of claim 7, wherein the portion of the lower-bandgap dielectric layer disposed outside of the isolation break contacts a low voltage element of the microelectronic device.

9. The microelectronic device of claim 1, wherein an edge of the lower-bandgap dielectric layer at the isolation break is covered with a dielectric material.

10. The microelectronic device of claim 1, wherein the silicon nitride of the first sub-layer has a thickness of about 600 nm.

11. A method of forming a microelectronic device, comprising:
    forming a lower plate of a high voltage component of the microelectronic device;
    forming a main dielectric at least 2 microns thick adjacent to the lower plate;

forming a lower-bandgap dielectric layer adjacent to the main dielectric opposite from the lower plate, comprising a layer of silicon nitride having a refractive index in the range of 2.11- 2.23;

forming an upper plate of the high voltage component adjacent to the lower-bandgap dielectric layer; and forming an isolation break in the lower-bandgap dielectric layer so that the lower-bandgap dielectric layer is not continuous at the isolation break and the isolation break surrounds the upper plate.

12. The method of claim 11, wherein the step of forming the lower-bandgap dielectric layer further comprises forming a silicon oxynitride layer between the silicon nitride and the main dielectric.

13. The method of claim 12, wherein the portion of the main dielectric adjacent to the lower-bandgap dielectric layer comprises silicon dioxide-based dielectric material.

14. The method of claim 11, wherein the main dielectric comprises a plurality of intra-metal dielectric (IMD) layers comprising silicon dioxide-based dielectric material and ILD layers comprising silicon dioxide-based dielectric material.

15. The method of claim 11, further comprising forming a low voltage component disposed outside of the isolation break.

16. The method of claim 15, wherein the low voltage component is a metal oxide semiconductor (MOS) transistor with a gate dielectric layer less than 70 nm thick.

17. The method of claim 11, wherein the step of forming the isolation break comprises removing the lower-bandgap dielectric layer in an area for the isolation break, leaving a portion of the lower-bandgap dielectric layer disposed outside of the isolation break.

18. The method of claim 17, wherein the portion of the lower-bandgap dielectric layer disposed outside of the isolation break contacts a low voltage element of the microelectronic device.

19. The method of claim 11, further comprising forming dielectric material on an edge of the lower-bandgap dielectric layer at the isolation break.

20. A device, comprising:

first and second semiconductor die each having a high voltage capacitor, the high voltage capacitor having:
 a lower plate;
 an upper plate;
 a main dielectric disposed between the lower plate and the upper plate; and
 a silicon nitride layer disposed between the main dielectric and the upper plate, wherein:
  the silicon nitride layer has a refractive index in the range of 2.11-2.23;
  the silicon nitride layer extends past the upper plate continuously around the upper plate, by a distance which is at least twice a thickness of the silicon nitride layer;
  there is an isolation break in the silicon nitride layer so that the silicon nitride layer is not continuous at the isolation break; and
  the isolation break surrounds the upper plate; and
a laminate inductor connected in parallel with an isolation barrier provided by the high voltage capacitor of the first and second semiconductor dies.

* * * * *